(12) United States Patent
Small et al.

(10) Patent No.: US 6,756,308 B2
(45) Date of Patent: Jun. 29, 2004

(54) CHEMICAL-MECHANICAL PLANARIZATION USING OZONE

(75) Inventors: Robert J. Small, Dublin, CA (US);
Xiaowei Shang, Sunnyvale, CA (US)

(73) Assignee: EKC Technology, Inc., Hayward, CA (US)

( * ) Notice: Subject to any disclaimer, the term of this patent is extended or adjusted under 35 U.S.C. 154(b) by 0 days.

(21) Appl. No.: 09/783,069

(22) Filed: Feb. 13, 2001

(65) Prior Publication Data

US 2002/0111026 A1 Aug. 15, 2002

(51) Int. Cl.$^7$ .............................................. H01L 21/302
(52) U.S. Cl. ...................................... 438/692; 438/691
(58) Field of Search .................................. 438/691, 692

(56) References Cited

U.S. PATENT DOCUMENTS

| | | | |
|---|---|---|---|
| 4,059,929 A | 11/1977 | Bishop | |
| 4,064,660 A | 12/1977 | Lampert | |
| 4,086,152 A | 4/1978 | Rich et al. | |
| 5,162,248 A | 11/1992 | Dennison et al. | |
| 5,270,241 A | 12/1993 | Dennison et al. | |
| 5,672,539 A | 9/1997 | Thakur et al. | |
| 5,800,251 A | 9/1998 | Nakazato et al. | |
| 5,837,612 A | 11/1998 | Ajuria et al. | |
| 5,857,893 A | 1/1999 | Olson et al. | |
| 5,858,830 A | 1/1999 | Yoo et al. | |
| 5,869,384 A | 2/1999 | Yu et al. | |
| 5,869,394 A | 2/1999 | Chen et al. | |
| 5,872,043 A * | 2/1999 | Chen ........................ | 438/424 |
| 5,926,722 A | 7/1999 | Jang et al. | |
| 5,957,759 A | 9/1999 | Cardenas et al. | |
| 5,976,979 A * | 11/1999 | Chen ........................ | 438/691 |
| 6,001,730 A * | 12/1999 | Farkas et al. ............... | 438/627 |
| 6,037,251 A | 3/2000 | Tu et al. | |
| 6,072,226 A | 6/2000 | Thakur et al. | |
| 6,100,198 A * | 8/2000 | Grieger et al. .............. | 438/692 |
| 6,106,788 A | 8/2000 | Rau et al. | |
| 6,110,431 A | 8/2000 | Dunder | |
| 6,110,830 A * | 8/2000 | Skrovan et al. ............. | 438/688 |
| 6,115,862 A | 9/2000 | Cooper et al. | |
| 6,123,602 A | 9/2000 | Rodriguez et al. | |
| 6,124,210 A * | 9/2000 | Chino et al. ................ | 438/706 |
| 6,143,673 A | 11/2000 | Jang et al. | |
| 2001/0027798 A1 | 10/2001 | Flierl et al. | |

FOREIGN PATENT DOCUMENTS

| | | |
|---|---|---|
| EP | 0 846 742 A2 | 10/1998 |
| JP | 08255791 | 10/1996 |
| JP | 11087285 | 3/1999 |
| WO | 00/17281 | 3/2000 |

OTHER PUBLICATIONS

International Search Report PCT/US02/03453.
Notification of Transmittal of the International Preliminary Examination Report and International Preliminary Examination Report mailed Aug. 12, 2003.

* cited by examiner

*Primary Examiner*—David Nelms
*Assistant Examiner*—Thao P. Le
(74) *Attorney, Agent, or Firm*—Parsons Hsue & de Runtz LLP

(57) ABSTRACT

The present invention relates to the use of ozone ($O_3$) as a reagent in chemical mechanical planarization either in aqueous solution or as a gas directly impinging on the surface to be planarized. An aqueous solution containing ozone may optionally contain abrasive particles and/or additional CMP reagents co-dissolved with the ozone including carbonate and bicarbonate anions, and organic acids such as formic, oxalic, acetic and glycol. Abrasives that may be added include alumina, silica, spinel, ceria, zirconia. Typical concentrations of ozone aqueous solution are in the range from approximately 1 part-per-million up to saturation. Ammonium salts, particularly ammonium carbonate, facilitate planarization in cooperation with ozone-containing aqueous solution. Low k dielectric materials, organic as well as inorganic, and difficult to oxidize metals can be planarized with ozone reagents pursuant to the present invention.

19 Claims, 3 Drawing Sheets

CHEMICAL-MECHANICAL PLANARIZATION USING OZONE

BACKGROUND OF THE INVENTION

1. Technical Field

The present invention relates to compositions and processes for the chemical mechanical planarization of surfaces in the fabrication of integrated circuits, and more particularly, to the use of ozone as an oxidizing agent in chemical mechanical planarization.

2. Description of Related Art

Chemical-mechanical planarization (CMP) is a process employed to remove various materials from wafer surfaces during the manufacture of integrated circuits, creating thereby a substantially planar surface that facilitates accurate patterning and deposition of subsequent layers. Typical CMP processes use a polishing pad rotating in contact with the wafer to be planarized with the introduction of a suitable CMP reagent between the wafer and polishing pad to facilitate material removal and planarization. CMP reagents typically include an abrasive slurry containing, among other components, abrasive particles and various oxidizing agents. Abrasive particles used for CMP include alumina, silica, spinel, ceria, zirconia, among others.

The areas of applicability of CMP processes have expanded to cover a large variety of materials, including metals. This expansion of applicability has stimulated a continuous search for new oxidizers that will make CMP processes of metal more effective. Oxidizers such as hydrogen peroxide, potassium ferricyanide, periodic acid, hydroxylamine and its salts, and other such oxidizers have resulted from this continuous search and are currently being employed in CMP processes of metal. However, these oxidizers have several drawbacks including, inter alia, they create waste streams such as ionic waste streams that must be treated and removed from CMP process areas. Additionally, these waste streams may also include metal oxides from the wafer surfaces themselves. Such waste streams are rather complex and are quiet difficult to treat and dispose of effectively. For the foregoing reasons, among others, there is a need for an oxidizer that will make CMP processes of metal more effective and reduce challenges associated with treating the typical ionic and complex waste streams of conventional CMP and their associated hazards to the environment.

The present invention provides chemical compositions and processes that increase the effectiveness of CMP processes (typically CMP of metals) and/or ameliorate the challenges of treating and disposing of present day ionic and complex waste streams in an environmentally friendly manner by making use of ozone ($O_3$) in aqueous and/or gaseous form. For example, the chemical compositions and processes pursuant to the present invention are particularly advantageous for CMP processes of tungsten, copper, silver, gold, platinum, iridium, ruthenium, and aluminum metals as well as for CMP processes of organic materials having a low dielectric constant ("low k").

Ozone has been used as a component of cleaning solutions used for contamination control and cleaning separate from the CMP process. For example, see Stanley Wolf and Richard N. Tauber, *SILICON PROCESSING FOR THE VLSI ERA, Volume* 1: *Process Technology,* $2^{nd}$ Ed. (Lattice Press, 2000), pp.131–133. Ozone cleaning of wafer surfaces following CMP is described, for example, by E. K. Greiger et. al., U.S. Pat. No. 6,100,198. Ozone has also been used as an oxidizer in the formation of structures integral to the integrated circuit. For example, ozone-enhanced local oxidation of silicon is used in forming a field isolation structure in the work of Thakur et. al. (U.S. Pat. Nos. 5,672,539 and 6,072,226). Ozone-rich TEOS layers (tetraethoxysilane layers) have been used in the formation of dielectric layers on integrated circuits in the work of Chen and Tu (U.S. Pat. No. 5,869,394) and Jang et. al. (U.S. Pat. No. 6,143,673).

However, in contrast to the prior art, the present invention makes use of ozone as a reagent in the practice of CMP. Ozone is employed in the form of a gas delivered directly to the surface to be planarized, and/or used in the form of an ozone-containing aqueous solution, optionally used in combination with abrasive particles, in combination with other CMP reagents, or used in other embodiments described herein and/or obvious to those having ordinary skills in the art.

SUMMARY

The present invention relates to the use of ozone ($O_3$) as a reagent in chemical mechanical planarization. Ozone can be delivered to the surface to be planarized in several forms, including in an aqueous solution or as a gas. An aqueous solution containing ozone may optionally contain abrasive particles and/or additional CMP reagents co-dissolved with the ozone. Co-reagents useful in CMP in cooperation with ozone include carbonate and bicarbonate anions, and organic acids such as formic, oxalic, acetic and glycol. Ozone can be delivered directly to the surface to be planarized in the form of a gas. Combinations of the foregoing ozone-containing reagents can be employed in CMP, optionally in cooperation with other non-ozone-containing CMP reagents, within the scope of the present invention.

Ozone ($O_3$) is typically formed in an ozone generator by passing oxygen through an energy field, typically a plasma or ion field, forming ozone in situ. In some embodiments of the present invention, it is convenient to generate the ozone and/or the ozone-containing reagent (or reagents) on-site as needed and proximate to the CMP apparatus where the ozone-containing reagent(s) will be consumed. Some embodiments of the present invention make use of ozone dissolved in water (preferably DI water) to form an aqueous solution. Typically the concentrations of ozone in DI water will be in the range from approximately 1 part-permillion ("ppm") up to saturation, possibly exceeding 20 ppm. Such an aqueous solution can be used directly for CMP, dispensing the solution between a wafer surface and a polishing pad to affect planarization.

Other embodiments of the present invention make use of ozone dissolved in water along with additional abrasive and/or reactive chemicals. Abrasives that may be added include alumina, silica, spinel, ceria, zirconia. Other reagents that may be added include carbonate and bicarbonate anions, oxalic acid, formic acid, acetic acid and glycol acids.

Ozone gas may be directly impinge on the surface to be planarized pursuant to other embodiments of the present invention.

The compositions of the present invention can be used for CMP of platinum and other materials that are difficult to planarize with conventional oxidizers. Other metals include ruthenium, iridium, gold and aluminum. The compositions of the present invention can also be employed to coact with silicon such that it can be polished to better surface finishes. Material removal can be facilitated pursuant to the present invention by the inclusion of ammonium salts, including ammonium chlorides, ammonium nitrate and particularly ammonium carbonates.

Ozone compositions pursuant to the present invention break down typical organic polymers, rubber or other low k materials, thereby directly polishing organic low k dielectric films.

The compositions of the present invention may be employed for polishing hard disk and micro electrical mechanical structures (MEMS) including films containing NiP, Cr, Al, $SiO_2$, Si or Al metal.

DETAILED DESCRIPTION

Figure 1:
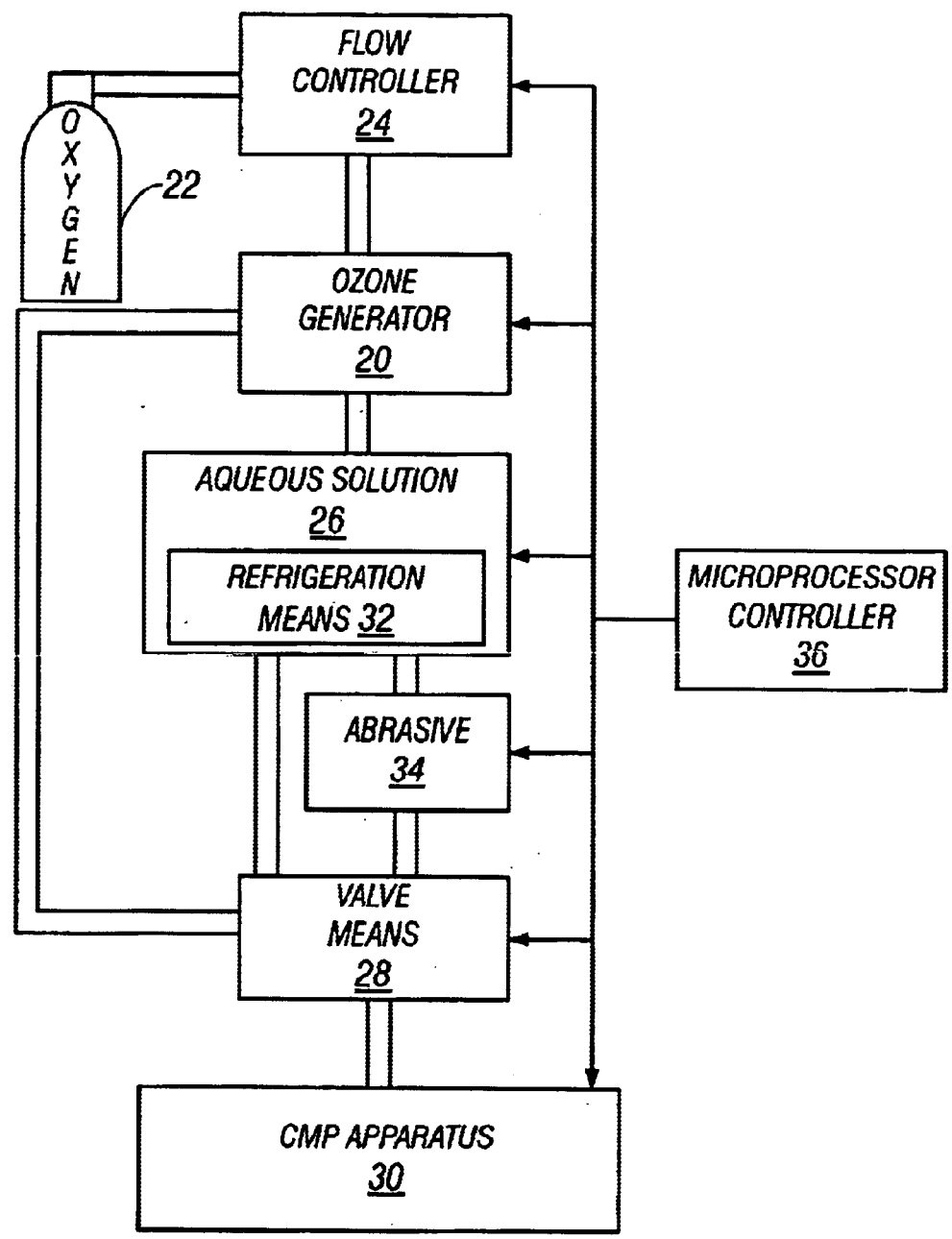
FIG. 1: Block diagram for ozone generation and flow pursuant to some embodiments of the present invention.

The present invention relates to the use of ozone ($O_3$) as a reagent in chemical mechanical planarization ("CMP") as performed in the fabrication of integrated circuits. Ozone for CMP pursuant to the present invention can be used in several forms. Ozone can be dissolved in water (preferably deionized —"DI"—water) to form an aqueous solution. An aqueous solution containing ozone may optionally contain abrasive particles and/or additional CMP reagents co-dissolved with the ozone. Co-reagents useful in CMP in cooperation with ozone include carbonate and bicarbonate anions, and organic acids such as formic, oxalic, acetic and glycol. Ozone can be delivered directly to the surface to be planarized in the form of a gas. Combinations of the foregoing ozone-containing reagents can be employed in CMP, optionally in cooperation with other non-ozone-containing CMP reagents, within the scope of the present invention.

Ozone ($O_3$) can be formed or generated in several ways including by means of an ozone generator passing oxygen through an energy field, typically a plasma or ion field, forming ozone in situ from a combination of three oxygen atoms. For example, ozone can be generated by silent discharge in an oxygen-containing gas. Silent discharge, in contrast to spark discharge, relates to a stable plasma discharge or coronal discharge. A portion of the molecular oxygen subject to the discharge is dissociated into atomic oxygen. The reactive oxygen atoms subsequently attach themselves in an exothermic reaction to molecular oxygen and form tri-atomic oxygen molecules, accordingly ozone. The ozone yield depends on the electric field strength and operating temperature among other factors. The dependence of yield on operating temperature relates to the fact that higher temperatures displace the equilibrium of Eq. 1 away from ozone, diminishing its yield.

Eq. 1.

Ozone generators are known in the art and commercially available. Thus, in some embodiments of the present invention, it is convenient to generate the ozone and/or the ozone-containing reagent (or reagents) on-site as needed and proximate to the CMP apparatus where the ozone-containing reagent(s) will be consumed. These embodiments overcome the difficulties presented by the fact that ozone is quite reactive and thermodynamically unstable with respect to molecular oxygen, $O_2$, making it challenging to retain ozone for a substantial period of time. However, the rate of ozone decomposition and/or reaction can be slow making it difficult, but not impossible, to store ozone or ozone-containing reagent(s) for later use. To be concrete in our description, we describe in detail embodiments of the present invention generating ozone on-site, understanding thereby that embodiments making use of ozone-containing reagent(s) previously generated are included within the scope of the present invention.

Some embodiments of the present invention make use of ozone dissolved in water (preferably DI water) to form an aqueous solution. Typically the concentrations of ozone in DI water will be in the range from approximately 1 part-per-million ("ppm") up to saturation, possibly exceeding 20 ppm, depending on solution temperature. For economy of language, we refer to such solutions of ozone dissolved in water as "Composition A."

Following ozone generation and dissolution in an aqueous solution to form Composition A, some embodiments of the present invention use Composition A directly for CMP. That is, in these embodiments, Composition A is dispensed between a wafer surface and a polishing pad to affect CMP leading to planarization. Conventional CMP equipment is typically used for performing CMP with Composition A.

More specifically, and referring to FIG. 1, an ozone generator 20 generates ozone from oxygen supplied by an oxygen source 22. A flow controller 24 is typically used to control the oxygen flow rate to the ozone generator 20. Once generated, the ozone is then typically delivered into an aqueous solution 26 such as DI water and dissolved therein to form Composition A pursuant to the present invention (or a modification of Composition A if DI water is not employed). Composition A (or modification) can then be ported through valve 28 to CMP apparatus 30 wherein the CMP process is preformed. As depicted in FIG. 1, these embodiments are a "point of use process" wherein the ozone generator is located quite close to the actual CMP apparatus 30 and supplies Composition A substantially immediately to the wafer being polished for obtaining maximum effective use of the oxidation properties of the ozone contained in Composition A.

The temperature of Composition A generated in 26 may optionally be controlled. In some embodiments, a refrigerator 32 may be used to lower the temperature of the aqueous ozone solution providing thereby a higher solubility of ozone. Refrigerating Composition A also allows one to maintain higher concentration of ozone for a longer period of time. However, there is typically a critical upper concentration of ozone above which undesirable reactions and interactions between dissolved ozone occurs. This critical concentration occurs at about 20 ppm.

Additionally many CMP processes are temperature dependent. Thus, better control of the planarization process is achieved by controlling the temperature of the CMP reagents.

Other embodiments of the present invention make use of ozone dissolved in water along with additional abrasive and/or reactive chemicals. This is also depicted in FIG. 1. The embodiments depicted in FIG. 1 show Composition A combined with an abrasive (or abrasive slurry or solution) 34 and mixed therewith to form another family of CMP reagents pursuant to the present invention. For economy of language, we denote by "Composition B" the reagents comprising aqueous ozone (Composition A) plus other additives, typically abrasives although other reagents are not excluded. Abrasives 34 that may be added to Composition A include alumina, silica, spinel, ceria, zirconia, or other abrasive. Other reagents that may be added include carbonate and bicarbonate anions, oxalic acid, formic acid, acetic acid and glycol acids. Once Composition B is formed it can be directed through valve 28 to the CMP apparatus 30 wherein the CMP process of metal is preformed.

Alternatively, the ozone generated in generator 20 could be delivered directly through valve 28 to CMP apparatus 30 for performing the CMP process of metal. A microprocessor controller 36 can be used to regulate the generation of ozone by the ozone generator 20, the flow from flow controller 24, the mixing of ozone with aqueous solution 26, the valve 28, the refrigerator 32, and the mixing of the ozone with abrasive 34. Additionally, microprocessor controller 36 or a separate microprocessor can also be used to control the CMP apparatus 30.

The CMP apparatus 30 can employ a conventional CMP delivery system to deliver Composition A or Composition B, between a wafer surface and a polishing pad to carry out the polishing leading to planarization. Gaseous ozone can also be used for planarization but is expected to be less effective than processes employing ozone in a liquid solution and requires introduction very close to the wafer surface. Even when gaseous ozone is employed, a polishing pad is required and water (or a similar fluid) is necessarily introduced to assist in removing etching by-products.

Figure 2:
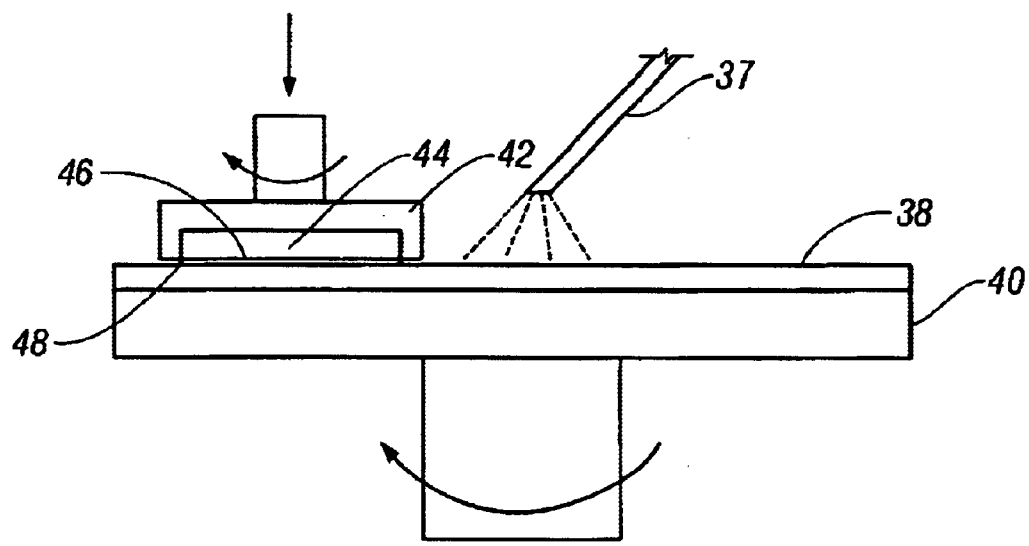
FIG. 2: Schematic cross-sectional depiction of typical chemical mechanical planarization.

However, it is important to note that ozone, even in solution, has high reactivity and typically a rather short lifetime when brought into contact with metal. Thus, the CMP compositions pursuant to the present invention are preferably applied very close to the wafer being polished instead of being applied further up or down stream as typically the case for some conventional CMP apparatus (typically 1 to 6 inches down-stream, in front of the wafer carrier). For example, and referring to FIG. 2, the CMP apparatus 30 can dispense Composition A or Composition B through a dispenser 37 and onto a polishing pad 38 at a location proximate a wafer carrier 42 carrying a wafer 44 having a wafer surface 46 undergoing planarization. The polishing pad 38 is carried on a platen 40 and, when the platen is rotated, centrifugal force causes the dispensed composition 48 (Composition A or Composition B) to be dispersed radially outward such that it is delivered between the wafer surface 46 and the polishing pad 38. Hence, the dispensed composition 48 and the relative motion of the polishing pad 38 with respect to the wafer carrier 42 leads to the planarization of wafer surface 46.

Figure 3:
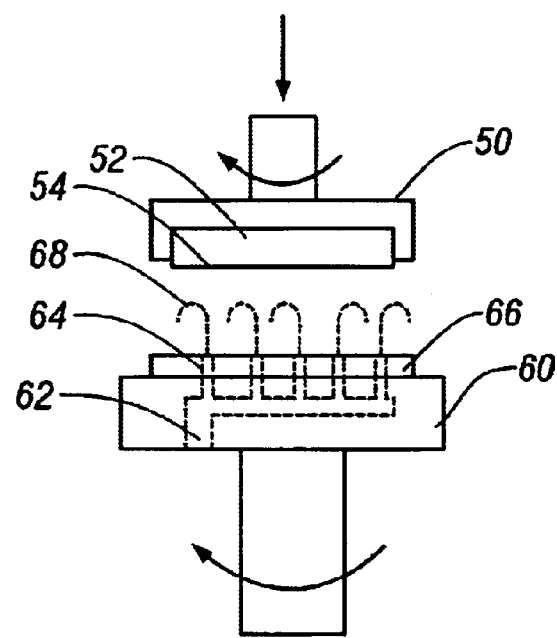
FIG. 3: Schematic cross-sectional depiction of through-platen reagent(s) delivery for chemical mechanical planarization.

Moreover, the chemical compositions and processes pursuant to the present invention are well suited for through-the-platen type of delivery systems that are common on, for example, Speedfam IPEC 576, 676, and 776 types of equipment, where the compositions are delivered through the platen to the actual face of the CMP wafer being polished, thereby providing a very good direct contact with little exposure of the compositions to other areas besides the face of the CMP wafer itself. For example, FIG. 3, is a schematic depiction of an orbital CMP head in which the chemical compositions (Composition A, Composition B, or ozone itself) pursuant to the present invention can be dispensed directly to the surface of the wafer. Such means of dispensing CMP reagent(s) typically results in improved distribution of the composition so dispensed.

More specifically, the CMP apparatus 30 can include an orbital CMP head comprised of wafer carrier 50 and platen 60. The CMP apparatus 30 can dispense any one of the chemical compositions (Composition A, Composition B, or ozone itself) through a manifold 62 disposed in the platen 60 which in turn is in open communication with openings 64 in the polishing pad 66 for dispensing any of these chemical compositions directly to a surface 54 of wafer 52 carried by wafer carrier 50. Thus, the dispensed composition 68 (Composition A, Composition B, or ozone itself) is directly delivered between the wafer surface 54 and the polishing pad 66 such that the dispensed composition 68 and the relative motion of the polishing pad 66 with respect to the wafer carrier 50 leads to the planarization of wafer surface 54.

Figure 4:
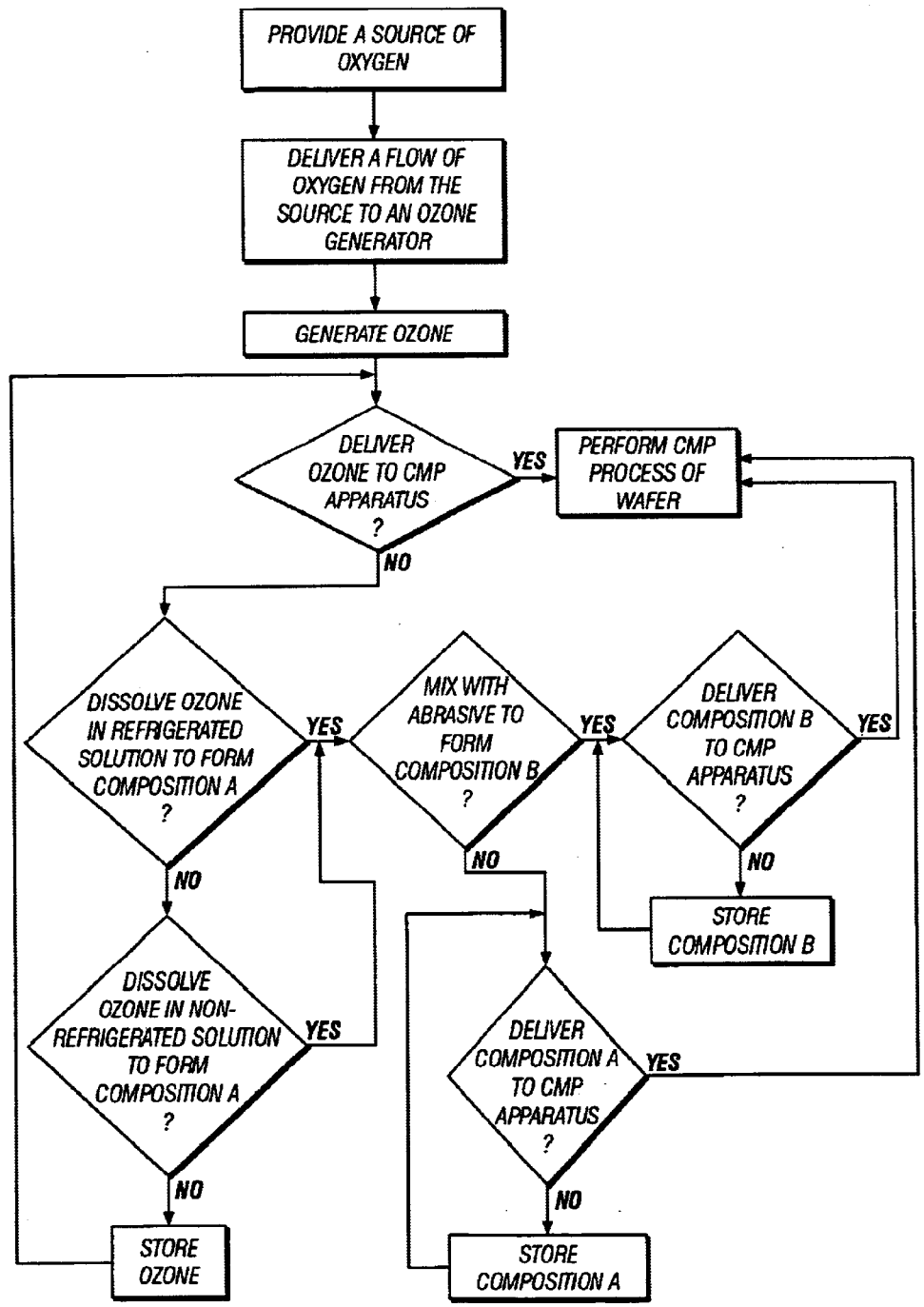
FIG. 4: Process flow chart for through-platen delivery of reagent(s), according to some embodiments of the present invention.

FIG. 4 further outlines the CMP processes described herein pursuant to the present invention. In particular, and referring to FIGS. 1 and 4, the source of oxygen is provided for delivering a flow of oxygen from the source to the ozone generator for generating ozone. Once the ozone is generated it can be delivered to the CMP apparatus 30 wherein the CMP process of metal is preformed. Alternatively, the ozone can be dissolved in a refrigerated aqueous solution or a non-refrigerated aqueous solution (optionally temperature controlled) to form Composition A. Next, the refrigerated Composition A or the non-refrigerated Composition A can be delivered to the CMP apparatus 30 wherein the CMP process of metal is preformed. Alternatively, the refrigerated Composition A or the non-refrigerated Composition A could be stored for later use or mixed with the abrasive. Mixing the refrigerated Composition A or the non-refrigerated Composition A with the abrasive forms Composition B which can then be delivered to the CMP apparatus 30 wherein the CMP process of metal is preformed. Alternatively, Composition B could be stored for later use.

The chemical compositions pursuant to the present invention are typically employed in a single phase polishing process. However, this does not preclude a two (or more) phase polishing system if a benefit is found in doing a light polishing, using another CMP composition(s) in subsequent processing steps and in the final clean up process. Moreover, it should be noted that ozone itself is a poisonous gas in high concentration so processes pursuant to the preset invention should be applied in polishing tools that have enclosed systems though the degree of danger is somewhat on the same order as one might see with hydrogen peroxide or other similarly deleterious compositions or slurries. Generally, CMP chemicals, should be handled with proper precautions since they typically all tend to have high oxidation powers.

The present invention further includes an important advantage in addition to ameliorating or overcoming one or more of the shortcomings of the known prior art as delineated supra. This advantage derives from the fact that the typical chemical compositions of the present invention containing ozone have a pH that is not at an extreme and typically have a pH in the range from about 2 to about 8. Thus, the chemical compositions pursuant to the present invention provide less aggressive CMP processing environments for oxide removal as compared to the pH ranges generally known in the art (typically, pH ranges 1–2 or 9–11). Overly aggressive removal of metal or oxide as caused by typical low pH CMP solutions tends to hinder planarization by removing oxide passivation layers formed in depressed regions of the surface. That is, one mechanism by which planarization is achieved relates to the formation of oxide layers on the surface that passivate the surface against chemical attack. Abrasion of higher surface regions in contact with the polishing pad thus removes material more rapidly from these higher regions than from depressed regions, not in contact with the polishing pad and partially protected from chemical material removal by the oxide passivation layer. Ozone aggressively oxidized metals but, at the typical pH ranges of 2–8 employed herein, oxide layers are not easily dissolved. Thus, less aggressive chemical attack on the oxide layer tends to preserve the passivation layer, leading to improved planarization. A final rinse is typically used to complete the CMP process.

The compositions of the present invention are favorably used for tungsten removal since a good oxide film is formed on tungsten layers in contact with the ozone-containing reagent(s) of the present invention, providing effective depressed-region protection. Preferential abrasion of elevated regions by contact with the polishing pad, or by contact with the polishing pad in cooperation with added abrasives, then leads to planarization.

The compositions of the present invention can also be used for CMP of platinum that is usually quite inert to typical oxidizers. For example, platinum is not readily planarized by such oxidizing solutions as nitric acid or nitric acid/hydrochloric acid combinations. However, the ozone-containing chemical compositions of the present invention typically form a platinum oxide film that can then be selectively removed in elevated regions by the abrasive action of the pad or by the pad in cooperation with the added abrasive. This process could be repeatedly preformed in order to speed up the platinum polishing process.

Also, films such as iridium typically require that an oxidation process be performed prior to CMP in order to increase the effectiveness of material removal. Hence, the iridium process can also be benefited by employing the compositions pursuant to the present invention by providing a strong oxidizing media to oxidize the film to iridium oxide that is then polished off.

The compositions of the present invention are also useful for the planarization of films containing ruthenium and/or ruthenium oxide.

The compositions of the present invention could also be employed to co-act with silicon such that it can be polished to better surface films. For example, should ozone more rapidly form silica ($SiO_2$) on the wafer surface, polishing removes silica as very small particles, 1–5 nm. Conventional CMP with a pH>9 typically involves the formation of silicate species, $[SiO_4]^{-4}$. Material removal in the form of very small particles typically results in a better surface finish.

Additionally, ozone has powerful oxidizing properties and tends to react vigorously with organic molecules such as surfactants, slurry stabilizers, chelators among others, thereby decreasing the effective ozone concentration if such additives are present in the CMP solution. However, to promote material removal, ammonium salts, including ammonium chlorides, ammonium nitrate and particularly ammonium carbonates, can be added to facilitate the polishing rates, though this may not always be necessary or may be used in certain cases with certain metals.

Furthermore, ozone can be used to open —C=C— or —C=N— bonds, promoting thereby a radical chain reaction to break down typical organic polymers, for example the SILK that is manufactured by Dow, BCB's manufactured by Dow Coming, rubber or other low k materials. Thus, the present invention could be used to directly polish organic low k dielectric films. The present invention also contemplates purging ozone into existing abrasives to do low k polishing.

Moreover, the compositions pursuant to the present invention may be employed for polishing hard disk and micro electrical mechanical structures (MEMS). Typical films for hard disks include NiP, Cr, Al, $SiO_2$ among others. MEMS structures are typically $SiO_2$, Si or Al metal.

In conclusion, the present invention ameliorates or overcomes one or more of the shortcomings of the known prior art by providing chemical compositions that contain ozone, and by providing CMP processes of metal and low k dielectric materials (organic or inorganic) with these chemical compositions while essentially leaving behind nothing more than either oxygen or metal oxide materials in particle form, thereby making CMP processes of metal more effective while eliminating present day ionic and complex waste streams, their associated treatments and their hazards to the environment. In particular, CMP of copper is an example of the effectiveness of the present invention, leaving oxide films in low-lying areas of the surface unetched, while the top layers are polished. Spin etching of copper is yet another area of application for the ozone-containing etchant compositions of the present invention.

Those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described.

What is claimed is:

1. A method of planarizing a surface comprising directing ozone gas onto said surface and causing relative motion of said surface and a polishing pad in contact therewith, wherein a fluid is present.

2. A method of planarizing a surface comprising directing onto said surface an aqueous solution comprising ozone and causing relative motion of said surface and a polishing pad in contact therewith.

3. A method as in claim 2 further comprising abrasive particles in said aqueous solution.

4. A method as in claim 3 wherein said abrasive particles are selected from a group consisting of alumina, silica, ceria, spinel, zirconia and mixtures thereof.

5. A method as in claim 3 further comprising at least one ammonium salt in said aqueous solution.

6. A method as in claim 5 wherein said at least one ammonium salt is ammonium carbonate.

7. A method as in claim 2 wherein the surface comprises a material selected from a group consisting of iridium, iridium oxide, and platinum.

8. A method as in claim 2 wherein the surface comprises a low k material.

9. A method as in claim 2 wherein the surface comprises a structure selected from a group consisting of a hard disk and a micro electrical mechanical structure.

10. A method as in claim 2 wherein said directing comprises directing the aqueous solution at a location proximate a carrier of the surface.

11. A method as in claim 10 wherein the location is less than one inch downstream of the surface.

12. A method as in claim 2 wherein a pH of the aqueous solution is from about 2 to about 8.

13. A method as in claim 2 wherein the aqueous solution comprises at least one reagent selected from a group consisting of carbonate anions, bicarbonate anions, oxalic acid, formic acid, acetic acid, and glycol acids.

14. A method as in claim 2, further comprising controlling a temperature of the aqueous solution.

15. A method as in claim 14 wherein said controlling comprises lowering the temperature.

16. A method as in claim 14 wherein said controlling comprises refrigerating the aqueous solution.

17. A method as in claim 2, further comprising controlling a concentration of ozone in the aqueous solution.

18. A method as in claim 17 wherein said controlling comprises controlling the concentration of ozone such that it is than less or equal to 20 ppm.

19. A method as in claim 2 comprising spin-etching of the surface.

* * * * *